(12) United States Patent
Meyer et al.

(10) Patent No.: US 12,094,842 B2
(45) Date of Patent: Sep. 17, 2024

(54) SEMICONDUCTOR DEVICE HAVING AN ANTENNA ARRANGED OVER AN ACTIVE MAIN SURFACE OF A SEMICONDUCTOR DIE

(71) Applicant: Infineon Technologies AG, Neubiberg (DE)

(72) Inventors: Thorsten Meyer, Regensburg (DE); Walter Hartner, Bad Abbach-Peissing (DE); Maciej Wojnowski, Munich (DE)

(73) Assignee: Infineon Technologies AG, Neubiberg (DE)

( * ) Notice: Subject to any disclaimer, the term of this patent is extended or adjusted under 35 U.S.C. 154(b) by 829 days.

(21) Appl. No.: 16/360,387

(22) Filed: Mar. 21, 2019

(65) Prior Publication Data

US 2019/0221531 A1 Jul. 18, 2019

Related U.S. Application Data

(63) Continuation of application No. 15/496,477, filed on Apr. 25, 2017, now abandoned.

(30) Foreign Application Priority Data

Apr. 26, 2016 (DE) .......................... 102016107678.3

(51) Int. Cl.
*H01L 23/522* (2006.01)
*H01L 23/00* (2006.01)
(Continued)

(52) U.S. Cl.
CPC .......... *H01L 23/66* (2013.01); *H01L 23/3114* (2013.01); *H01L 23/5226* (2013.01); *H01L 23/5227* (2013.01); *H01L 24/19* (2013.01); *H01L 24/20* (2013.01); *H01L 29/0657* (2013.01); *H01Q 1/2283* (2013.01); *H01L 23/3128* (2013.01); *H01L 24/13* (2013.01); *H01L 24/16* (2013.01); *H01L 24/29* (2013.01); *H01L 24/32* (2013.01); *H01L 24/81* (2013.01); *H01L 24/83* (2013.01); *H01L 2223/6677* (2013.01); *H01L 2224/12105* (2013.01); *H01L 2224/13024* (2013.01);
(Continued)

(58) Field of Classification Search
CPC .......................... H01L 23/5227; H01L 23/645
See application file for complete search history.

(56) References Cited

U.S. PATENT DOCUMENTS 5,432,374 A 7/1995 Norton
5,773,870 A 6/1998 Su et al.
(Continued)

FOREIGN PATENT DOCUMENTS

CN 101996979 A 3/2011
CN 101997506 A 3/2011

*Primary Examiner* — Anh D Mai
(74) *Attorney, Agent, or Firm* — Murphy, Bilak & Homiller, PLLC

(57) ABSTRACT

A semiconductor device includes a semiconductor die having an active main surface and an opposite main surface opposite the active main surface. The semiconductor device further includes an antenna arranged on the active main surface of the semiconductor die and a recess arranged on the opposite main surface of the semiconductor die. The recess is arranged over the antenna.

10 Claims, 5 Drawing Sheets

(51) Int. Cl.
*H01L 23/31* (2006.01)
*H01L 23/66* (2006.01)
*H01L 29/06* (2006.01)
*H01Q 1/22* (2006.01)

(52) U.S. Cl.
CPC ............ *H01L 2224/16227* (2013.01); *H01L 2224/32225* (2013.01); *H01L 2224/73204* (2013.01); *H01L 2224/73267* (2013.01); *H01L 2224/81203* (2013.01); *H01L 2224/81815* (2013.01); *H01L 2224/83102* (2013.01); *H01L 2224/83825* (2013.01); *H01L 2224/8384* (2013.01); *H01L 2224/8385* (2013.01); *H01L 2924/10158* (2013.01); *H01L 2924/15311* (2013.01); *H01L 2924/18162* (2013.01)

(56) References Cited

U.S. PATENT DOCUMENTS

| | | | |
|---|---|---|---|
| 5,864,180 A * | 1/1999 | Hori | H01L 21/2022 |
| | | | 257/774 |
| 5,930,637 A | 7/1999 | Chuang et al. | |
| 6,727,570 B2 | 4/2004 | Woo | |
| 2006/0157798 A1 | 7/2006 | Hayashi et al. | |
| 2008/0311706 A1 | 12/2008 | Dozen et al. | |
| 2009/0085133 A1 | 4/2009 | Doan | |
| 2009/0189801 A1 | 7/2009 | Forstner et al. | |
| 2012/0080770 A1* | 4/2012 | Wahl | H01L 23/48 |
| | | | 257/531 |
| 2014/0036462 A1 | 2/2014 | Wang et al. | |
| 2016/0308270 A1 | 10/2016 | Ding et al. | |

\* cited by examiner

SEMICONDUCTOR DEVICE HAVING AN ANTENNA ARRANGED OVER AN ACTIVE MAIN SURFACE OF A SEMICONDUCTOR DIE

TECHNICAL FIELD

The present disclosures relates in general to semiconductor devices. More particular, the disclosure relates to semiconductor devices with on-chip antennas and methods for manufacturing such semiconductor devices.

BACKGROUND

High frequency (HF) applications, such as e.g. radar applications, may include one or more HF semiconductor dies and respective antennas coupled thereto. Operational requirements and parameters of HF applications evolve over time. In particular, operational frequencies of HF applications may increase in the future. Manufacturers of HF applications seek to provide solutions of reduced size and manufacturing costs.

SUMMARY

Various aspects pertain to a semiconductor device including a semiconductor die having an active main surface and an opposite main surface opposite the active main surface. The semiconductor device includes an antenna arranged on the active main surface of the semiconductor die and a recess arranged on the opposite main surface of the semiconductor die. The recess is arranged over the antenna.

Various aspects pertain to a semiconductor device including a semiconductor die having an active main surface and an opposite main surface opposite the active main surface. The semiconductor device includes an antenna arranged on the active main surface of the semiconductor die. The opposite main surface of the semiconductor die includes an epitaxial layer, wherein the epitaxial layer is exposed from semiconductor material and arranged over the antenna.

Various aspects pertain to a method including the following acts: providing a semiconductor die having an active main surface and an opposite main surface opposite the active main surface; forming an antenna on the active main surface of the semiconductor die; and removing semiconductor material from the opposite main surface of the semiconductor die in an area over the antenna.

BRIEF DESCRIPTION OF THE DRAWINGS

The accompanying drawings are included to provide a further understanding of aspects and are incorporated in and constitute a part of this specification. The drawings illustrate aspects and together with the description serve to explain principles of aspects. Other aspects and many of the intended advantages of aspects will be readily appreciated as they become better understood by reference to the following detailed description. The elements of the drawings are not necessarily to scale relative to each other. Like reference signs may designate corresponding similar parts.

DETAILED DESCRIPTION

Figure 1:
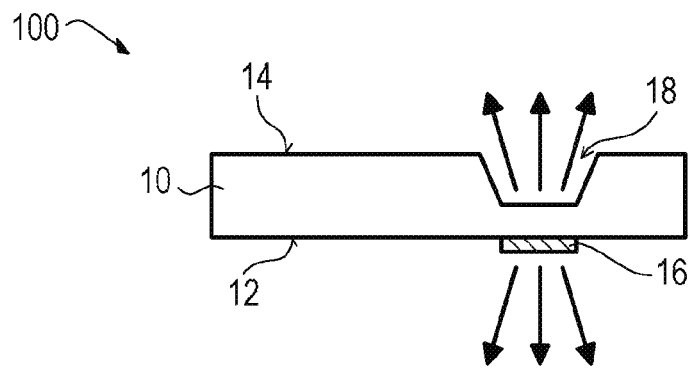
FIG. 1 schematically illustrates a cross-sectional side view of a semiconductor device 100 in accordance with the disclosure. The device 100 includes a semiconductor die having an antenna arranged on an active main surface of the semiconductor die. A recess is arranged over the antenna on the opposite main surface of the semiconductor die.

In the following detailed description, reference is made to the accompanying drawings, in which are shown by way of illustration specific aspects in which the disclosure may be practiced. In this regard, directional terminology, such as "top", "bottom", "front", "back", etc. may be used with reference to the orientation of the figures being described. Since components of described devices may be positioned in a number of different orientations, the directional terminology may be used for purposes of illustration and is in no way limiting. Other aspects may be utilized and structural or logical changes may be made without departing from the concept of the present disclosure. Hence, the following detailed description is not to be taken in a limiting sense, and the concept of the present disclosure is defined by the appended claims.

The devices described herein may include one or more semiconductor dies (or semiconductor chips). The semiconductor dies may be of different types, may be manufactured by different technologies and may include, for example, logic integrated circuits, analogue integrated circuits, mixed signal integrated circuits, power integrated circuits, electro-optical circuits, memory circuits, control circuits, microprocessors, or integrated passive devices. The semiconductor dies may include wireless components, for example transmitters, receivers, transceivers, sensors, or detectors. The semiconductor dies may be manufactured from specific semiconductor material such as, for example, Si, SiC, SiGe, GaAs, GaN, AlGaN, InGaAs, InAlAs, etc., and, furthermore, may contain inorganic and/or organic materials that are not semiconductors.

In particular, the semiconductor dies may include microwave circuitry, for example microwave transmitters, microwave receivers, microwave transceivers, microwave sensors, or microwave detectors. In general, the microwave frequency region may range from about 300 MHz (wavelength of about 1 meter) to about 300 GHz (wavelength of about 1 mm). By way of example, the semiconductor dies described herein may include integrated microwave circuitry operating in a frequency range greater that 20 GHz, more particular greater than 60 GHz, more particular greater than 100 GHz, more particular greater than 140 GHz, and even more particular greater than 170 GHz.

The semiconductor dies may have a horizontal structure. A semiconductor die having a horizontal structure may have electrodes on only one of its two main surfaces. In this regard, the term "active main surface" of a semiconductor die may be used herein and may particularly relate to the main surface of the semiconductor die including the electrodes of the semiconductor die. The electrodes may allow electrical contact to be made with the integrated circuits (e.g. microwave transmitter/receiver/transceiver/detector circuitry, controller circuitry, etc.) included in the semiconductor die. The semiconductor die electrodes, e.g. I/O electrodes, ground electrodes, power supply electrodes, microwave frequency electrodes, control electrodes, etc., may include one or more electrode metal layers that may be applied to the semiconductor material.

Similarly, the term "active main surface" may also relate to a main surface of the semiconductor die including active structures, i.e. microelectronic components and integrated circuits. Semiconductor dies may be manufactured from semiconductor wafers that may serve as a substrate for microelectronic devices to be built in and over the semiconductor wafer. The devices may be manufactured by doping, ion implantation, deposition of materials, photolithographic patterning, etc. The manufacturing processes usually may be performed on a specific main surface of the semiconductor wafer which may also be referred to as the "active main surface" of the semiconductor wafer. After separating individual semiconductor dies from the semiconductor wafer, the active main surface of the semiconductor wafer becomes the active main surface of the separated semiconductor dies. The term "opposite main surface" or a semiconductor die may refer to a main surface of the semiconductor die arranged opposite to the active main surface of the semiconductor die. The opposite main surface of the semiconductor die may be free of microelectronic devices, i.e. it may consist of (bulk) semiconductor material.

A semiconductor die may include an active area that may particularly be arranged at (or under) the active main surface of the semiconductor die. The active area may include the active structures arranged in the semiconductor material of the semiconductor die. In general, an active structure may include at least one of a doped region, an electrical component, an integrated circuit, etc. In particular, an active structure may include at least one of a diode, a transistor, a fuse, a transistor, a resistor, a capacitor, etc. The bulk semiconductor material and the active structures of a semiconductor die may be separated from each other by an epitaxial layer.

The devices described herein may include metallization layers that may be configured to interconnect active structures in the semiconductor die. During a fabrication of semiconductor dies, active structures or individual devices (e.g. transistors, capacitors, resistors, etc.) may be formed in the semiconductor material on wafer level. Once the various active structures have been formed, the structures may be electrically interconnected on wafer level to form desired electrical circuits. The interconnection process may include the formation of above mentioned metallization layers and dielectric layers arranged between the metallization layers to electrically insulate them from each other. For example, the metallization layer may be formed from copper, aluminum or associated metal alloys. The metallization layers may be seen as an internal electrical interconnection structure of the semiconductor die.

The devices described herein may include one or more redistribution layers including metallization layers that may extend over the active main surface of the semiconductor die and beyond. The metallization layers may be partially located outside and/or inside an outline (or a footprint or a contour) of the semiconductor die. The metallization layers may be configured to provide electrical contact with a semiconductor die from outside the semiconductor device including the semiconductor die. In particular, the metallization layers may electrically couple contact elements of the semiconductor die to external contact elements of the semiconductor device. In other words, the metallization layers may be configured to make I/O pads of the semiconductor die available in other locations. The metallization layers may e.g. have the shape of conductor lines or layers. For example, at least one of aluminum, nickel, palladium, titanium, tungsten, silver, tin, gold, molybdenum, vanadium or copper, or associated metals or alloys of the mentioned metals may be used for manufacturing the metallization layers. Dielectric layers may be arranged between the metallization layers to electrically insulate them from each another. It is to be noted that the specified redistribution layer may be distinguished from the previously described semiconductor die internal metallization layers configured to electrically connect active structures in the semiconductor die.

The devices described herein may include one or more antennas. For example, an antenna may be a dipole antenna, a coplanar patch (CPW) antenna, an array of two dipole antennas, a Vivaldi antenna, etc. An antenna may have a length $l_{antenna}$ of about $$l_{antenna} = \frac{\lambda}{2}$$

wherein $\lambda$ denotes the wavelength of signals transmitted by the antenna. The wavelength $\lambda$ may be calculated according to $$\lambda = \frac{c_0}{f\sqrt{\epsilon_r \mu_r}}$$

wherein $c_0$ denotes the vacuum speed of light, f denotes the frequency of the transmitted signals, $\epsilon_r$ denotes the dielectric constant of the material passed by the transmitted signals, and $\mu_r$ denotes the magnetic permeability of the material passed by the transmitted signals. In particular, the antennas may be configured for microwave transmission.

Depending on an operational frequency f of integrated microwave circuitry, a corresponding antenna length may be calculated based on above equations. Exemplary values of operational frequency ranges have been provided above. For example, a length of an antenna may be smaller than about 2 millimeter or 1.5 millimeter or 1 millimeter or 900 micrometer or 800 micrometer or 700 micrometer or 600 micrometer. Table 1 provides exemplary antenna lengths for specific frequency values for an example of a silicon oxide material and corresponding values for $\in_r$ and $\mu_r$.

TABLE 1

| Frequency | Antenna length |
|---|---|
| 77 GHz | 1.97 mm |
| 100 GHz | 1.52 mm |
| 140 GHz | 1.08 mm |
| 170 GHz | 893 µm |
| 200 GHz | 759 µm |
| 500 GHz | 304 µm |

An antenna may be formed in one or more metallization layers of the semiconductor die. In one example, an antenna may be formed in one or more metallization layers interconnecting active structures in the semiconductor die. In a further example, an antenna may be formed in one or more metallization layers of a redistribution layer. Devices as described herein may include one or more antennas formed in one or both of the specified layers.

The devices described herein may include an encapsulation material that may at least partly cover (or embed or encapsulate) one or more components of the device. The encapsulation material may be electrically insulating and may form an encapsulation body. The encapsulation material may include at least one of an epoxy, a glass fiber filled epoxy, a glass fiber filled polymer, an imide, a filled or non-filled thermoplastic polymer material, a filled or non-filled duroplastic polymer material, a filled or non-filled polymer blend, a thermosetting material, a mold compound, a glob-top material, a laminate material. Various techniques may be used to encapsulate components of the device with the encapsulation material, for example at least one of compression molding, injection molding, powder molding, liquid molding, transfer molding, lamination.

The devices described herein may be used in various applications. By way of example, a device as described herein may be used for telecommunications, industrial, vehicular, scientific or medical purposes. In particular, it may be used in cordless phones, Bluetooth devices, near field communication (NFC) devices, motor vehicles, and wireless computer network. Such applications are, inter alia, covered by the ISM (industrial, scientific and medical) radio bands which are defined, inter alia, by the ITU-R in 5.138, 5.150, and 5.280 of the ITU Radio Regulations, which are incorporated herein by way of reference. For instance, ISM radio bands may be used at frequencies at about 24 GHz, 61 GHz, 80 GHz, and 122 GHz. In addition, devices as described herein may be used for radar (radio detection and ranging) applications. Radar microwave devices may be used in automotive or industrial applications for range finding/range measuring systems. By way of example, vehicular automatic cruise control systems or vehicular anti-collision systems may operate in the microwave frequency region, e.g. at about 24 GHz or 80 GHz. It is noted that operational frequencies of the specified applications may increase in the future.

Figure 2:
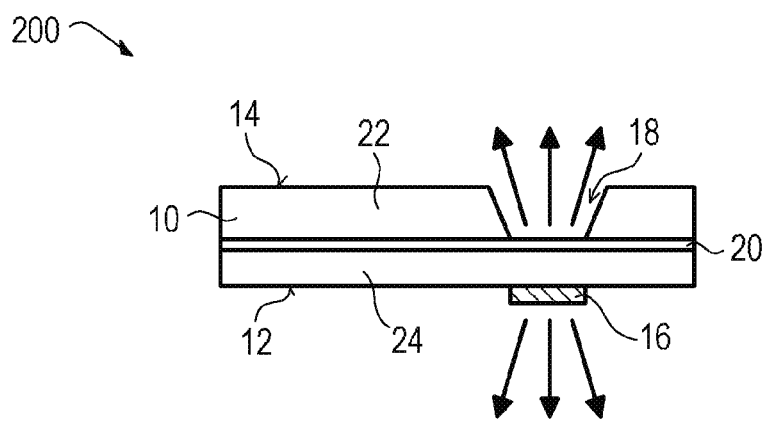
FIG. 2 schematically illustrates a cross-sectional side view of a semiconductor device 200 in accordance with the disclosure. The semiconductor device 200 includes a semiconductor die having an antenna arranged on an active main surface of the semiconductor die. The opposite main surface of the semiconductor die comprises an exposed epitaxial layer arranged over the antenna.

FIGS. 1 and 2 schematically illustrate cross-sectional side views of semiconductor devices 100 and 200 in accordance with the disclosure. Each of the semiconductor devices 100 and 200 is illustrated in a general manner in order to qualitatively specify aspects of the disclosure. The semiconductor devices 100 and 200 may include further components which are not illustrated for the sake of simplicity. For example, the semiconductor devices 100 and 200 may further include one or more components of other semiconductor devices in accordance with the disclosure.

The semiconductor device 100 of FIG. 1 may include a semiconductor die 10 having an active main surface 12 and an opposite main surface 14 opposite the active main surface 12. The semiconductor device 100 may further include an antenna 16 arranged on the active main surface 12 of the semiconductor die 10. The antenna 16 may e.g. be formed in one or more metallization layers of the semiconductor device 100. For the sake of simplicity the metallization layers are not illustrated in the example of FIG. 1. In one example, the antenna 16 may be formed in one or more metallization layers interconnecting active structures in the semiconductor die 10. In a further example, the antenna 16 may be formed in one or more metallization layers of a redistribution layer. The semiconductor device 100 may further include a recess 18 arranged on the opposite main surface 14 of the semiconductor die 10, wherein the recess 18 may be arranged over the antenna 16. In particular, the recess 18 may be arranged in a bulk semiconductor material of the semiconductor die 10 that may be free of active structures. Note that more detailed semiconductor devices in accordance with the disclosure are described below.

In the example of FIG. 1, an outline of the antenna 16 may be arranged in an outline of the semiconductor die 10 when viewed in a direction perpendicular to the active main surface 12. In particular, the size of the antenna 16 may be small enough such that the antenna 16 may be completely arranged in the contour of the semiconductor die 10 and may not extend over it. In other semiconductor devices, antennas may be arranged at least partly outside of an outline of an associated semiconductor die, for example over an encapsulation material surrounding the semiconductor die. Compared to such other semiconductor devices, the size of the semiconductor device 100 may be reduced due to the on-chip arrangement of the antenna 16.

During an operation of the semiconductor device 100, integrated circuitry of the semiconductor die 10 may operate in e.g. a microwave frequency range and may generate microwave signals that may be transmitted via the antenna 16. For example, the microwave radiation may be transmitted in directions that are indicated by arrows in FIG. 1. In an upward direction, the radiation may need to pass from the antenna 16 through the semiconductor material of the semiconductor die 10, wherein a radiation performance of the semiconductor device may be lowered. For example, a dielectric constant $\in_r$ of silicon may have a value of about 11.9 which may result in power losses of transmitted signals. Due to the recess 18 arranged in the opposite main surface 14 of the semiconductor die 10, a distance to be passed by the transmitted signals through the semiconductor material may be reduced such that above described power losses may be avoided. The arrangement of FIG. 1 thus provides a reduced size of the semiconductor device 100 combined with reduced power losses of transmitted radiation. An overall performance of the semiconductor device 100 may be increased.

The semiconductor device 200 of FIG. 2 may be at least partly similar to the semiconductor device 100. The semiconductor device 200 may include a semiconductor die 10 having an active main surface 12 and an opposite main surface 14 opposite the active main surface 12. The semiconductor device 200 may further include an antenna 16 arranged on the active main surface 12 of the semiconductor die 10. The semiconductor die 10 may include an epitaxial layer 20. In one example, the epitaxial layer 20 may separate an upper part 22 of the semiconductor die 10 from a lower part 24 of the semiconductor die 10. The upper part 22 may consist of a bulk semiconductor material which does not necessarily contain active electronic structures of the semiconductor die 10. The lower part 24 may include active structures of the semiconductor die 10, wherein the active structures may be at least partly included in the epitaxial layer 20 as well. The opposite main surface 14 of the semiconductor die 10 may include the epitaxial layer 20, wherein the epitaxial layer 20 may be at least partly exposed from the semiconductor material of the semiconductor die 10. The epitaxial layer 20, and in particular the exposed part of the epitaxial layer 20, may be arranged over the antenna 16.

In the example of FIG. 2, the opposite main surface 14 of the semiconductor die 10 may include a recess 18 similar to FIG. 1. The bottom of the recess 18 may include an exposed part of the epitaxial layer 20. In a further example, the exposed epitaxial layer 20 may form a plane surface and may particularly form the entire opposite main surface 14. Note that the term "exposed" does not necessarily mean that the epitaxial layer 20 is uncovered by any other material than the semiconductor material of the semiconductor die 10. For example, the recess 18 may be filled with a material having a dielectric constant smaller than the dielectric constant of the semiconductor material of the semiconductor die 10. The semiconductor device 200 may provide similar technical features as the semiconductor device 100 of FIG. 1 described above.

Figure 3A:
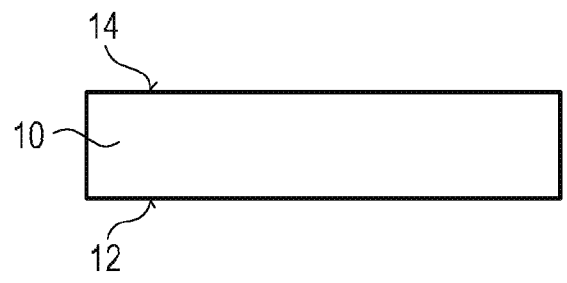
FIGS. 3A to 3C schematically illustrate respective cross-sectional views of a method for manufacturing a semiconductor device 300 in accordance with the disclosure. The semiconductor device 300 may be similar to the semiconductor device 100.
Figure 3B:
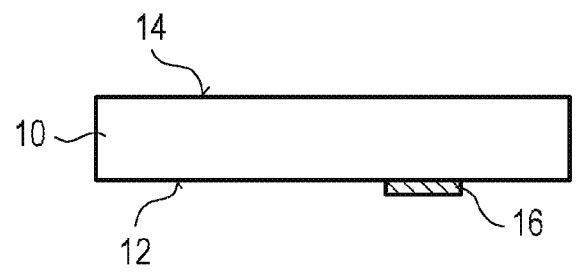
Figure 3C:
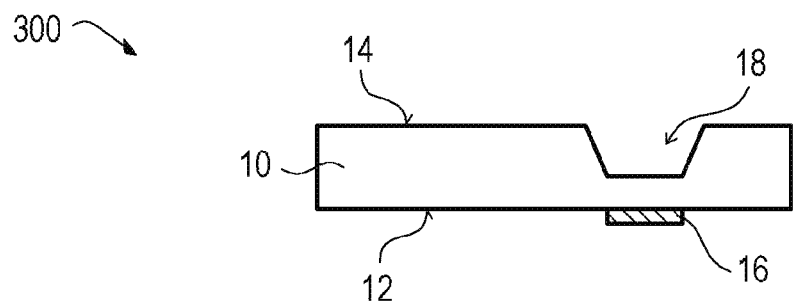

FIGS. 3A to 3C schematically illustrate respective cross-sectional side views of a method for manufacturing a semiconductor device 300 in accordance with the disclosure, a cross section of which is shown in FIG. 3C. The semiconductor device 300 may be similar to the semiconductor device 100. FIGS. 3A to 3C illustrate the fabrication of a single semiconductor device 300. However, an arbitrary number of similar semiconductor devices may be manufactured simultaneously, for example on wafer level.

In FIG. 3A, a semiconductor die 10 having an active main surface 12 and an opposite main surface 14 opposite the active main surface 12 may be provided. For example, the semiconductor die 10 may be a part of a semiconductor wafer including an arbitrary number of further semiconductor dies which are not illustrated for the sake of simplicity. Active structures may have been formed in the semiconductor die 10 on wafer level including integrated circuitry that may operate in a microwave frequency range.

In FIG. 3B, an antenna 16 may be formed on the active main surface 12 of the semiconductor die 10. In one example, the antenna 16 may be formed in one or more metallization layers interconnecting active structures in the semiconductor die 10. In a further example, the antenna 16 may be formed in one or more metallization layers of a redistribution layer. The antenna 16 may be formed on wafer level. The antenna 16 may be configured to transmit signals generated by integrated circuitry of the semiconductor die 10.

In FIG. 3C, semiconductor material may be removed from the opposite main surface 14 of the semiconductor die 10 in an area over the antenna 16. In the example of FIG. 3C, semiconductor material may be removed such that a recess 18 may be formed over the antenna 16. Any suitable technique may be used for removing the semiconductor material. In one example, the semiconductor may be removed by a process employing laser radiation. In a further example, the semiconductor may be removed using an etching process. Here, the opposite main surface 14 of the semiconductor die 10 (or a semiconductor wafer including the semiconductor die 10) may be coated by at least one of a lamination process, a spray process, a printing process and a spin-coating process. An applied etch resist may be structured at areas over the antenna 16 where semiconductor material is to be removed by using at least one of a mask aligner, a stepper and an LDI (laser direct imaging) tool or a laser tool. If a printed etch resist is used, the structuring may already be performed during the application process. The semiconductor material may then be etched away from the opposite main surface 14 to form the desired recess 18. Here, the semiconductor material may be etched in one or multiple acts. In one example, the etching process may include a dry etching process which may e.g. be based on an $SF_6$ etch chemistry. In a further example, the etching process may include a wet etching process which may e.g. be based on a KOH etch chemistry. After the etching has been performed and the recess 18 has been formed, the etch resist may be removed and further method acts may be performed which are not illustrated for the sake of simplicity. Also, a so-called "Bosch-Process" or a similar process may be used for removing the silicon in order to obtain straight sidewalls of the etched area.

In one example, the etching process of FIG. 3C may be performed until an epitaxial layer of the semiconductor die 10 may be exposed. Since the epitaxial layer may have an etching rate different from an etching rate of the bulk semiconductor material, the etching process may automatically stop at the epitaxial layer. In the example of FIG. 3C, semiconductor material may be removed such that a recess 18 may be formed over the antenna 16. In further examples, the entire opposite main surface 14 of the semiconductor die 10 may be uniformly etched, for example until an epitaxial layer of the semiconductor die 10 is exposed from the bulk semiconductor material.

Figure 4A:
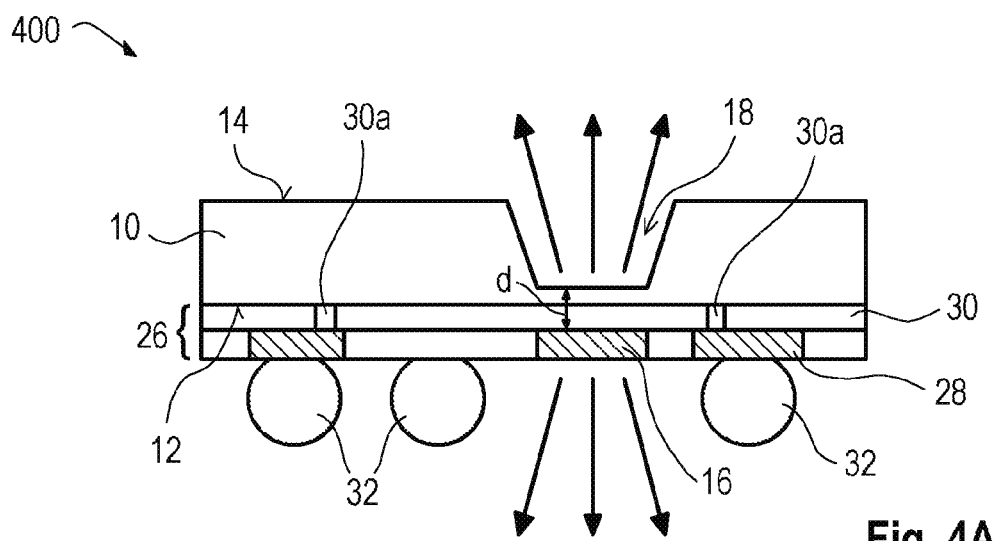
FIG. 4A schematically illustrates a cross-sectional side view of a semiconductor device 400 in accordance with the disclosure.
Figure 4B:
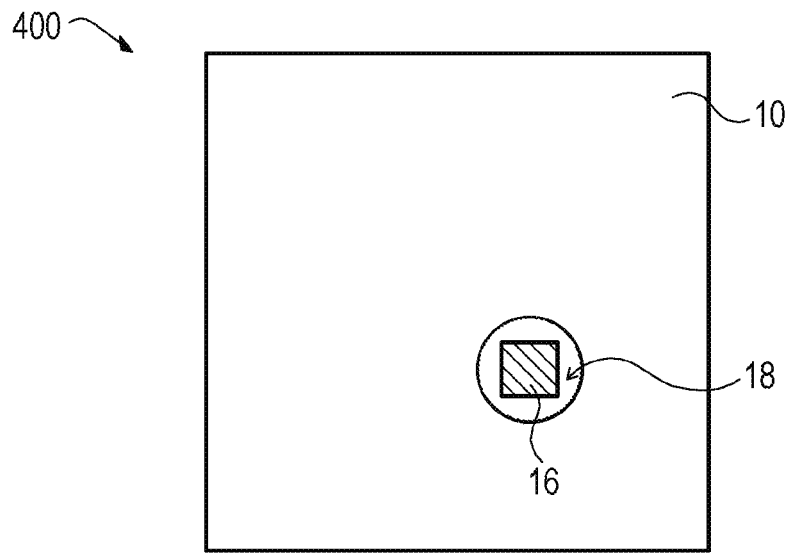
FIG. 4B illustrates a top view of the semiconductor device 400. The semiconductor device 400 may be seen as a more detailed implementation of the semiconductor devices 100 to 300.

FIG. 4A schematically illustrates a cross-sectional side view of a semiconductor device 400 in accordance with the disclosure, and FIG. 4B illustrates a top view of the semiconductor device 400. The semiconductor device 400 may be seen as a more detailed implementation of the semiconductor devices 100 to 300 such that details of the semiconductor device 400 described below may be likewise applied to the semiconductor devices 100 to 300.

Referring to the cross-sectional side view of FIG. 4A, the semiconductor device 400 may include a semiconductor die 10 and an electrical redistribution layer 26 applied over an active main surface 12 of the semiconductor die 10. The redistribution layer 26 may include one or more structured metallization layers 28 and one or more structured dielectric layers 30.

The dielectric layers 30 of the redistribution layer 26 may include or may be made of a polymer material (e.g. polyimide, epoxy, silicone, etc.). The dielectric layers 30 may have openings 30a that may be aligned to electrodes (not illustrated) of the semiconductor die 10. The metallization layers 28 may be electrically connected through the openings 30a to the semiconductor die 10. In particular, a structured part 16 of one or more of the metallization layers 28 may be electrically connected to the semiconductor die 10 and may form an on-chip antenna 16 in the redistribution layer 26. It is noted that in further examples, similar on-chip antennas may be alternatively or additionally formed in one or more metallization layers interconnecting active structures in the semiconductor die 10. FIG. 4A does not illustrate a detailed internal structure of the semiconductor die 10 for the sake of simplicity such that die internal metallization layers are not shown.

The semiconductor device 400 may include external contact elements 32, such as e.g. solder deposits. For example, the external contact elements 32 may be configured to mount and electrically connect the semiconductor device 400 to a carrier (not illustrated), such as e.g. a PCB (printed circuit board). The redistribution layer 26 may provide an electrical connection between electrodes (not illustrated) of the semiconductor die 10 and the external contact elements 32.

The semiconductor device 400 may correspond to a wafer level package. Wafer-level packaging is the technology of packaging an integrated circuit while still part of the wafer. In particular, the semiconductor device 400 may correspond to a fan-in wafer level package. Here, the term "fan-in" may particularly indicate that the external contact elements 32 of the semiconductor device 400 may be arranged (in particular completely) inside an outline of the semiconductor die 10 when viewed in a direction perpendicular to the active main surface 12 of the semiconductor die 10. However, it is to be noted that aspects of the present disclosure do not necessarily depend on a specific package type of considered semiconductor devices. Further semiconductor devices in accordance with the disclosure and representing other package types are described below.

The semiconductor device 400 may include a recess 18 arranged on the opposite main surface 14 of the semiconductor die 10, wherein the recess 18 may be arranged over the antenna 16 in a bulk semiconductor material of the semiconductor die 10. In one example, the recess 18 may extend into the bulk semiconductor material to such a depth that the bottom of the recess 18 may be formed by an epitaxial layer exposed from the bulk semiconductor material. A distance "d" between a bottom of the recess 18 and the antenna 16 may be smaller than about 10 micrometer or 9 micrometer or 8 micrometer or 7 micrometer or 6 micrometer or 5 micrometer or 4 micrometer.

The recess 18 may be of arbitrary shape. In the example of FIG. 4A, the recess 18 may have a trapezoidal cross section with inclined side walls. Such cross sectional shape may e.g. result from an isotropic etching process that may have been applied for forming the recess 18. Here, the cross section of the recess 18 may increase in a direction from a bottom of the recess 18 to the opposite main surface 14 of the semiconductor die 10. In a further example, the side walls of the recess 18 may be substantially perpendicular to the active main surface 12 of the semiconductor die 10. In yet a further example, the cross section of the recess 18 may have a conical shape.

In the example of FIG. 4A, the recess 18 may remain unfilled. In further examples, the recess 18 may be filled with an additional material (not illustrated). In particular, the recess 18 may be filled with a material having a dielectric constant smaller than the dielectric constant of the semiconductor material of the semiconductor die 10 that has been removed in order to form the recess 18. A dielectric constant of a silicon semiconductor material may have a value of about 11.9. A dielectric constant of the filler material may thus have a value of e.g. smaller than 10, 9, 8, 7, 6, 5, 4, 3, 2 or 1. For example, the recess 18 may be filled with at least one of an epoxy, an imide, a thermoplastic polymer material, a duroplastic polymer material, a polymer blend, a thermosetting material, a mold compound, a glob-top material, a laminate material. The material may be unfilled or filled with fillers of one or more materials, one or more forms and one or more filler sizes.

The arrows in FIG. 4A illustrate, by way of example, possible directions of TX microwave signals. It is also possible to have a TX direction of microwave signals in a lateral direction. Analogously, an RX direction may, e.g., be the up or down or lateral direction. The recess 18 may result in technical effects that have already been described in connection with foregoing figures. For example, power losses of transmitted radiation may be reduced.

In the example of FIG. 4A, only one antenna 16 and one recess 18 arranged over the antenna 16 are illustrated. However, the semiconductor device 400 may also include further antennas and further recesses arranged over these antennas. In one example, a recess may be arranged over each antenna. In a further example, a recess may be arranged over more than only one antenna. In yet a further example, bulk semiconductor material of the semiconductor die 10 may have been removed over the entire active main surface 14 of the semiconductor die 10. That is, the active main surface 14 may correspond to an even plane at the level of the bottom of the recess 18 in FIG. 4A.

Referring to the top view of FIG. 4B, an outline of the antenna 16 may be arranged in an outline of the semiconductor die 10 when viewed in a direction perpendicular to the active main surface 12. In the example of FIG. 4B, the antenna 16 is indicated as a simple rectangle and an inner structure of the antenna 16 is not illustrated for the sake of simplicity. An outline of the recess 18 may at least partly overlap with an outline of the antenna 16 when viewed in a direction perpendicular to the active main surface 12. In the example of FIG. 4B, the entire outline of the antenna 16 lies inside the contour of the recess 18. In a further example, the entire contour of the recess 18 may lie inside the outline of the antenna 16.

Figure 5:
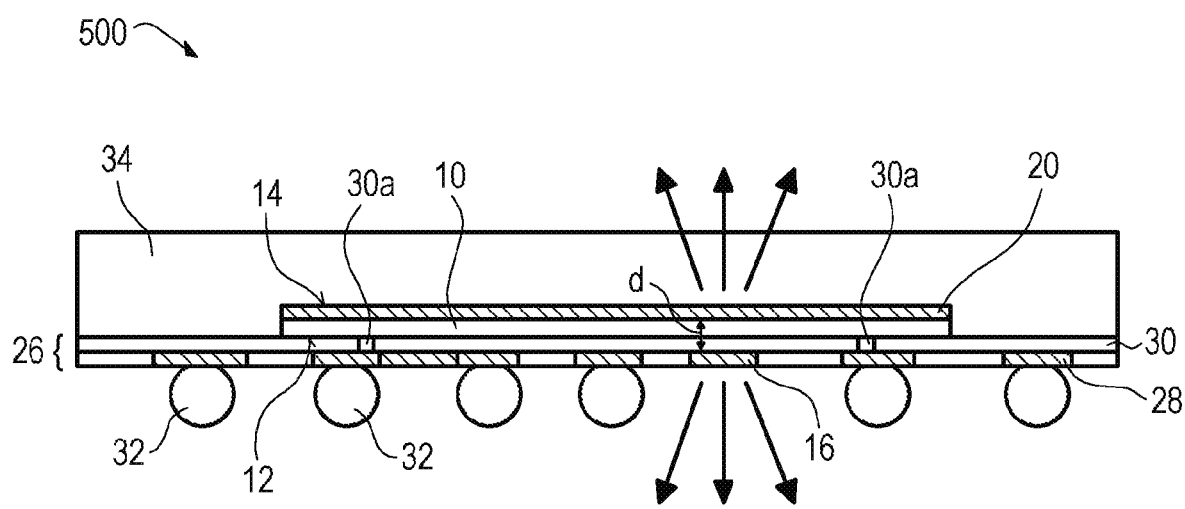
FIG. 5 schematically illustrates a cross-sectional side view of a semiconductor device 500 in accordance with the disclosure. The semiconductor device 500 may be seen as a more detailed implementation of the semiconductor devices 100 to 300.

FIG. 5 schematically illustrates a cross-sectional side view of a semiconductor device 500 in accordance with the disclosure. The semiconductor device 500 may be seen as a more detailed implementation of the semiconductor devices 100 to 300 such that details of the semiconductor device 500 described below may be likewise applied to the semiconductor devices 100 to 300. The semiconductor device 500 may at least partly be similar to the semiconductor device 400 of FIGS. 4A and 4B.

The semiconductor device 500 may include a semiconductor die 10 and an electrical redistribution layer 26 applied over an active main surface 12 of the semiconductor die 10. The redistribution layer 26 may include one or more structured metallization layers 28 and one or more structured dielectric layers 30. An on-chip antenna 16 may be formed in the redistribution layer 26. In further examples, similar on-chip antennas may be alternatively or additionally formed in one or more metallization layers interconnecting active structures in the semiconductor die 10. The semiconductor device 500 may further include external contact elements 32, such as e.g. solder deposits, that may be electrically coupled to the semiconductor die 10 via the redistribution layer 26. Comments made in connection with FIGS. 4A and 4B for similar components may also hold true for FIG. 5.

The semiconductor device 500 may correspond to an embedded wafer level (eWLB) package. In particular, the semiconductor device 500 may correspond to a fan-out wafer level package. Here, the term "fan-out" may particularly indicate that one or more of the external contact elements 32 of the semiconductor device 500 may be arranged outside of an outline of the semiconductor die 10 when viewed in a direction perpendicular to the active main surface 12 of the semiconductor die 10.

The semiconductor die 10 may include an epitaxial layer 20. In particular, the opposite main surface 14 of the semiconductor die 10 may correspond to a surface of the epitaxial layer 20 that may be exposed from a semiconductor material of the semiconductor die 10. In this regard, semiconductor material of the semiconductor die 10 previously arranged over the epitaxial layer 20 may have been removed during a fabrication of the semiconductor device 500. A distance "d" between the epitaxial layer 20 and the antenna 16 may be smaller than about 10 micrometer or 9 micrometer or 8 micrometer or 7 micrometer or 6 micrometer or 5 micrometer or 4 micrometer.

The semiconductor device 500 may include an encapsulation material 34 that may constitute an artificial or reconstituted wafer during an eWLB manufacturing process of the semiconductor device 500. The encapsulation material 34 may cover the opposite main surface 14 and the side surfaces of the semiconductor die 10, wherein the lower main surface of the encapsulation material 34 may be coplanar with the active main surface 12 of the semiconductor die 10. The redistribution layer 26 may extend over the active main surface 12 of the semiconductor die 10 and the lower main surface of the encapsulation material 34.

The encapsulation material 34 may include at least one of an epoxy, a glass fiber filled epoxy, a glass fiber filled polymer, an imide, a filled or non-filled thermoplastic polymer material, a filled or non-filled duroplastic polymer material, a filled or non-filled polymer blend, a thermosetting material, a mold compound, a glob-top material, a laminate material. In particular, a dielectric constant of the encapsulation material 34 may be smaller than a dielectric constant of the semiconductor material of the semiconductor die 10. For example, a mold compound may have an exemplary dielectric constant of about 3. The encapsulation material 34 may be similar to the material that may fill the recess 18 of the semiconductor device 400 which has been described in connection with FIGS. 4A and 4B.

The arrows in FIG. 5 illustrate, by way of example, the direction of a TX microwave signal. In the example of FIG. 5, only one antenna 16 is illustrated. In further examples, the semiconductor device 500 may include further on-chip antennas. It is noted that the semiconductor device 500 may also include off-chip antennas, i.e. antennas which are not arranged (in particular completely) over the semiconductor die 10, but e.g. over the lower main surface of the encapsulation material 34. The reduced distance between the opposite main surface 14 of the semiconductor die 10 and the antenna 16 may result in technical effects that have already been described in connection with foregoing examples. For example, power losses of transmitted radiation may be reduced.

Figure 6:
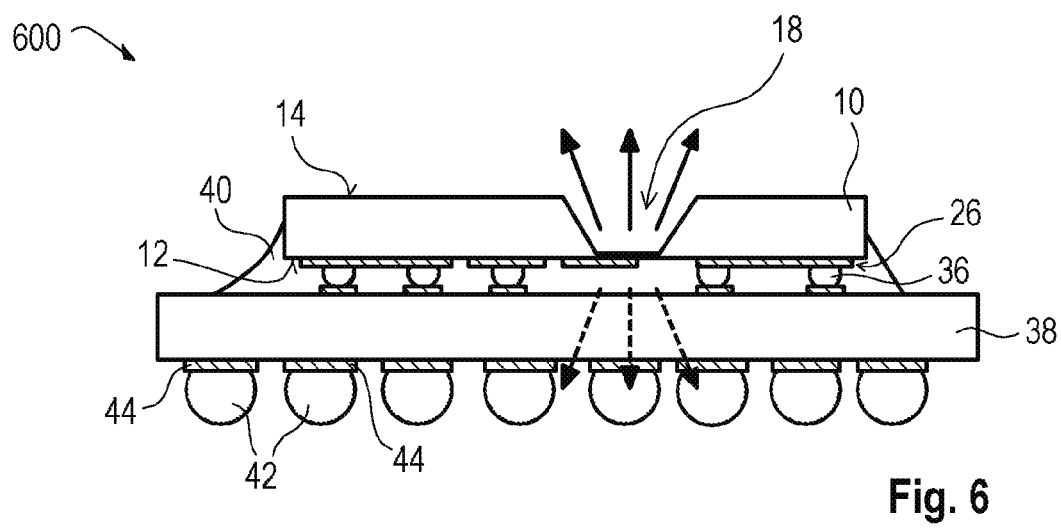
FIG. 6 schematically illustrates a cross-sectional side view of a semiconductor device 600 in accordance with the disclosure. The device 600 may be seen as a more detailed implementation of the semiconductor devices 100 to 300.

FIG. 6 schematically illustrates a cross-sectional side view of a semiconductor device 600 in accordance with the disclosure. The semiconductor device 600 may be seen as a more detailed implementation of the semiconductor devices 100 to 300 such that details of the semiconductor device 600 described below may be likewise applied to the semiconductor devices 100 to 300. The semiconductor device 600 may at least partly be similar to the semiconductor device 400 of FIGS. 4A and 4B.

The semiconductor device 600 may be manufactured according to a flip-chip technology. The semiconductor device 600 may include a semiconductor die 10 with a redistribution layer 26 applied over an active main surface 12 of the semiconductor die 10. Contact elements 36 may be applied to the redistribution layer 26, for example solder bumps, stud bumps, copper pillars or any other flip-chip first level interconnects. The contact elements 36 may have been applied on wafer level. In a further example, the contact elements 36 may also have been directly applied over the pads of the semiconductor die 10, in this case a redistribution layer may not be available under the contact elements 36. A recess 18 may be arranged in the opposite main surface 14 of the semiconductor die 10. The specified components may be similar to corresponding components of the semiconductor device 400 of FIGS. 4A and 4B.

The semiconductor device 600 may further include a substrate 38. For example, the semiconductor die 10 may be attached to the substrate 38 by applying a mass reflow process or using a thermo-compression bonding type application. In further examples, the semiconductor die 10 may be glued, sintered or diffusion soldered to the substrate 38. In the example of FIG. 6, the contact elements 36 of the semiconductor die 10 may correspond to solder bumps and a capillary underfill may have been used for attaching the semiconductor die 10 to the substrate 38. The underfill material 40 may be optional and may include or be made of an epoxy material in one example. The semiconductor device 600 may further include external contact elements 42, such as e.g. solder deposits, that may be applied to electric contacts 44 on the lower main surface of the substrate 38. The external contact elements 42 may be electrically coupled to the semiconductor die 10 via the substrate 38.

In the example of FIG. 6, the opposite main surface 14 of the semiconductor die 10 may be bare or exposed. In further examples, the opposite main surface 14 may be at least partly covered by an additional material (not illustrated). In one example, the additional material may be similar to the material that may fill the recess 18 of semiconductor device 400 that has been described in connection with FIGS. 4A and 4B. The additional material may e.g. be applied in form of a tape, a sprayed layer, a laminated layer.

Figure 7:
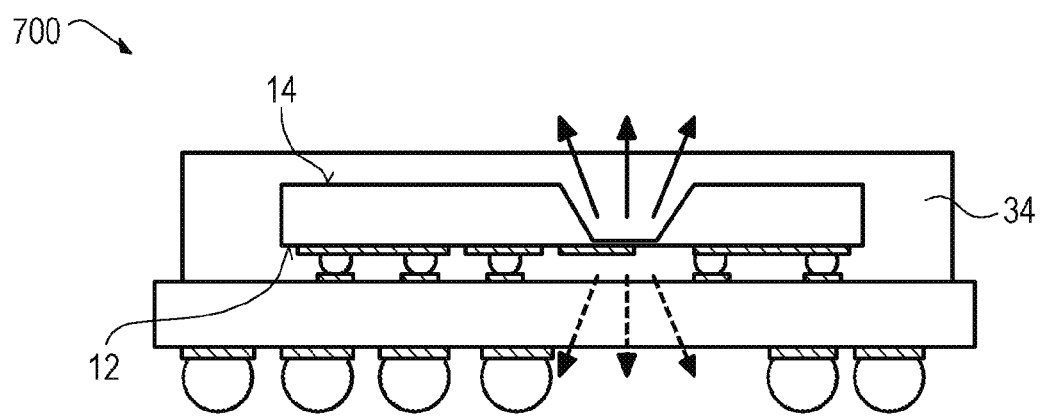
FIG. 7 schematically illustrates a cross-sectional side view of a semiconductor device 700 in accordance with the disclosure. The semiconductor device 700 may be seen as a more detailed implementation of the semiconductor devices 100 to 300.

FIG. 7 schematically illustrates a cross-sectional side view of a semiconductor device 700 in accordance with the disclosure. The semiconductor device 700 may be seen as a more detailed implementation of the semiconductor devices 100 to 300 such that details of the semiconductor device 700 described below may be likewise applied to the semiconductor devices 100 to 300.

The semiconductor device 700 may be manufactured according to a flip-chip technology. The semiconductor device 700 may at least partly be similar to the semiconductor device 600 of FIG. 6. In contrast to FIG. 6, the semiconductor device 700 may include an encapsulation material 34 which may be arranged over the active main surface 12 and over the opposite main surface 14 of the semiconductor die 10. In one example, the encapsulation material 34 may be similar to the encapsulation material 34 of FIG. 5.

Figure 8A:
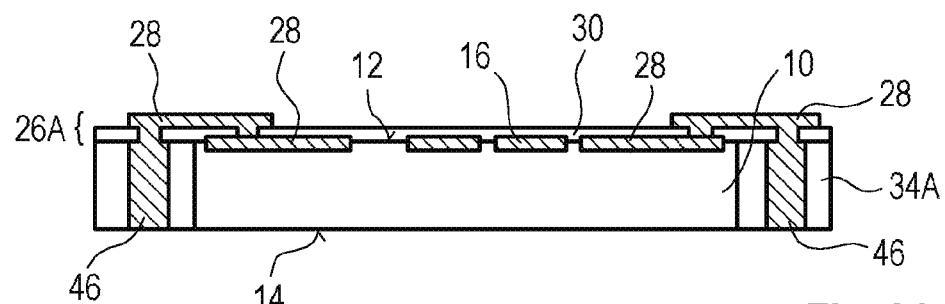
FIGS. 8A to 8D schematically illustrate respective cross-sectional side views of a method for manufacturing a semiconductor device 800 in accordance with the disclosure. The device 800 may be seen as a more detailed implementation of the semiconductor devices 100 to 300.
Figure 8B:
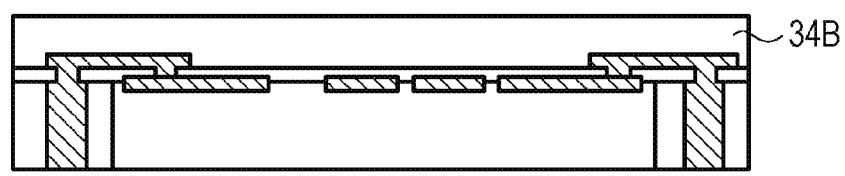
Figure 8C:
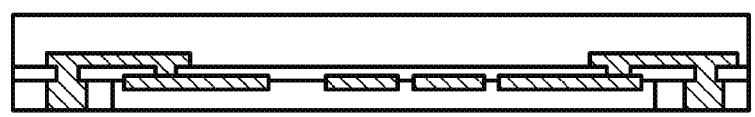
Figure 8D:
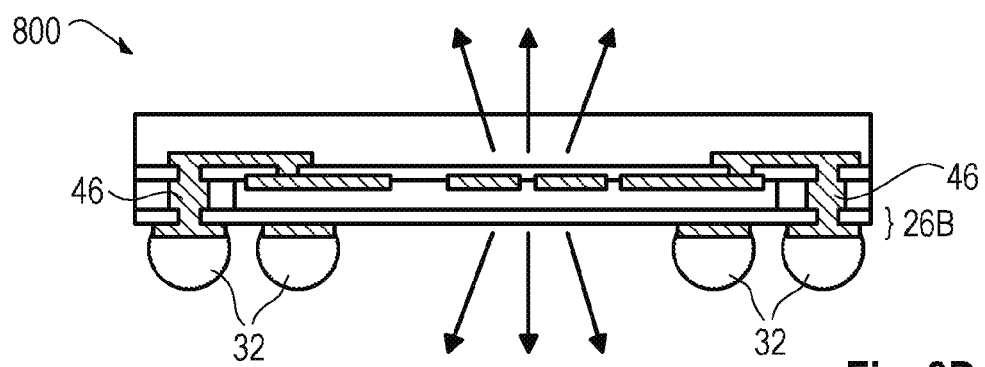

FIGS. 8A to 8D schematically illustrate respective a cross-sectional views of a method for manufacturing a semiconductor device 800 in accordance with the disclosure, a cross section of which is shown in FIG. 8D. The semiconductor device 800 may be seen as a more detailed implementation of the semiconductor devices 100 to 300 such that details of the semiconductor device 800 described below may be likewise applied to the semiconductor devices 100 to 300. FIGS. 8A to 8D illustrate the manufacturing of one semiconductor device 800. However, an arbitrary number of similar semiconductor devices may be manufactured simultaneously.

In FIG. 8A, an intermediate semiconductor device may be provided. It is noted that one or more method acts may have been performed before in order to fabricate the arrangement of FIG. 8A. The arrangement may include a die 10 embedded in a first encapsulation material 34A. An active main surface 12 of the semiconductor die 10 may be coplanar with an upper main surface of the first encapsulation material 34A, and an opposite main surface 14 of the semiconductor die 10 may be coplanar with a lower main surface of the first encapsulation material 34A. A first redistribution layer 26A may be arranged over the active main surface 12 of the semiconductor die 10. The first redistribution layer 26A may include one or more structured metallization layers 28 and one or more structured dielectric layers 30. An on-chip antenna 16 may be formed in the first redistribution layer 26A. Vias 46 may extend through the first encapsulation material 34A from its lower main surface to its upper main upper surface. The first redistribution layer 26A may be electrically coupled to electrodes (not illustrated) of the semiconductor die 10 and to the vias 46 such that an electrical connection between the semiconductor die 10 and the lower surface of the arrangement may be provided.

In FIG. 8B, a second encapsulation material 34B may be applied to the upper main surface of the arrangement. In one example, the second encapsulation material 34B may be similar to the first encapsulation material 34A.

In FIG. 8C, material may be uniformly removed from the lower surface of the arrangement. That is, the first encapsulation material 34A, the vias 46 and semiconductor material of the semiconductor die 10 may be removed such that the lower surface of the device may form a plane surface. In particular, the semiconductor material of the semiconductor die 10 may be removed to an extent as described in connection with previous figures. Any suitable technique may be used for removing the material, for example at least one of grinding, laser ablation, etching, cutting, etc.

In FIG. 8D, a second redistribution layer 26B may be applied to the lower surface of the arrangement. The second redistribution layer 26B may provide an electrical connection between the vias 46 and external contact elements 32, such as e.g. solder deposits, that may be applied to the lower surface of the second redistribution layer 26B. The semiconductor die 10 may thus be electrically accessible via the external contact elements 32.

As employed in this specification, the terms "connected", "coupled", "electrically connected" and/or "electrically coupled" may not necessarily mean that elements must be directly connected or coupled together. Intervening elements may be provided between the "connected", "coupled", "electrically connected" or "electrically coupled" elements.

Further, the word "over" used with regard to e.g. a material layer formed or located "over" a surface of an object may be used herein to mean that the material layer may be located (e.g. formed, deposited, etc.) "directly on", e.g. in direct contact with, the implied surface. The word "over" used with regard to e.g. a material layer formed or located "over" a surface may also be used herein to mean that the material layer may be located (e.g. formed, deposited, etc.) "indirectly on" the implied surface with e.g. one or more additional layers being arranged between the implied surface and the material layer.

Furthermore, to the extent that the terms "having", "containing", "including", "with" or variants thereof are used in either the detailed description or the claims, such terms are intended to be inclusive in a manner similar to the term "comprising". That is, as used herein, the terms "having", "containing", "including", "with", "comprising" and the like are open-ended terms that indicate the presence of stated elements or features, but do not preclude additional elements or features. The articles "a", "an" and "the" are intended to include the plural as well as the singular, unless the context clearly indicates otherwise.

Moreover, the word "exemplary" is used herein to mean serving as an example, instance, or illustration. Any aspect or design described herein as "exemplary" is not necessarily to be construed as advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form. Also, at least one of A and B or the like generally means A or B or both A and B.

Devices and methods for manufacturing devices are described herein. Comments made in connection with a described device may also hold true for a corresponding method and vice versa. For example, if a specific component of a device is described, a corresponding method for manufacturing the device may include an act of providing the component in a suitable manner, even if such act is not explicitly described or illustrated in the figures. In addition, the features of the various exemplary aspects described herein may be combined with each other, unless specifically noted otherwise.

Although the disclosure has been shown and described with respect to one or more implementations, equivalent alterations and modifications will occur to others skilled in the art based at least in part upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor device, comprising:
   a semiconductor die comprising an active main surface, an opposite main surface opposite the active main surface, and an epitaxial layer at least partly exposed from semiconductor material of the semiconductor die; and
   an antenna arranged over the active main surface of the semiconductor die,
   wherein the epitaxial layer is arranged over the antenna.

2. The semiconductor device of claim 1, further comprising:
a recess in the opposite main surface of the semiconductor die which extends to the epitaxial layer to expose the epitaxial layer from the semiconductor material of the semiconductor die in a region of the recess.

3. The semiconductor device of claim 2, wherein the recess is filled with a material having a dielectric constant smaller than the dielectric constant of the semiconductor material of the semiconductor die.

4. The semiconductor device of claim 1, wherein the exposed part of the epitaxial layer is arranged over the antenna.

5. A semiconductor device, comprising:
a semiconductor die comprising an upper semiconductor part, a lower semiconductor part, and an epitaxial layer that separates the upper semiconductor part from the lower semiconductor part, the epitaxial layer being partly exposed from the upper semiconductor part; and
an antenna arranged over the lower semiconductor part of the semiconductor die,
wherein the epitaxial layer is arranged over the antenna.

6. The semiconductor device of claim 5, further comprising:
a recess in the upper semiconductor part of the semiconductor die which extends to the epitaxial layer to expose the epitaxial layer from the upper semiconductor part in a region of the recess.

7. The semiconductor device of claim 6, wherein the recess is filled with a material having a dielectric constant smaller than the dielectric constant of a semiconductor material of the semiconductor die.

8. The semiconductor device of claim 5, wherein the exposed part of the epitaxial layer is arranged over the antenna.

9. The semiconductor device of claim 5, wherein the upper semiconductor part of the semiconductor die does not contain active electronic structures of the semiconductor device, and wherein the lower semiconductor part of the semiconductor die includes active structures of the semiconductor device.

10. The semiconductor device of claim 9, wherein the active structures are partly included in the epitaxial layer.

* * * * *